United States Patent [19]

Rhoden et al.

[11] Patent Number: 5,124,645
[45] Date of Patent: Jun. 23, 1992

[54] TRANSMISSION ELECTRON MICROSCOPE (TEM) POWER PROBE FOR IN-SITU VIEWING OF ELECTROMIGRATION AND OPERATION OF AN INTEGRATED CIRCUIT OR MICROPROCESSOR

[75] Inventors: William E. Rhoden, Schertz, Tex.; Donald R. Kitchen, Dumfries, Va.; James V. Maskowitz, Holmdel, N.J.

[73] Assignee: The United States of America as represented by the Secretary of the Air Force, Washington, D.C.

[21] Appl. No.: 690,462

[22] Filed: Apr. 24, 1991

[51] Int. Cl.⁵ .................. G01R 31/02; G21K 5/10
[52] U.S. Cl. .................. 324/158 F; 250/311; 250/442.11; 324/158 R
[58] Field of Search .............. 324/158 F, 158 R, 703, 324/719; 250/310, 311, 440.1, 441.1, 442.1, 443.1

[56] References Cited

U.S. PATENT DOCUMENTS

| | | | |
|---|---|---|---|
| 3,867,697 | 2/1975 | Vanzetti et al. | 324/158 |
| 3,896,314 | 7/1975 | Nukui et al. | 250/442.1 |
| 3,939,415 | 2/1976 | Terasawa | 324/158 |
| 4,413,181 | 11/1983 | Feuerbaum | 250/310 |
| 4,855,673 | 8/1989 | Todokoro | 324/158 |
| 5,036,205 | 7/1991 | Clement et al. | 250/440.1 |

FOREIGN PATENT DOCUMENTS

0227347  11/1985  Japan .................. 250/440.1

OTHER PUBLICATIONS

Blazek et al; "Sample Holder . . . "; Rev. of Sci. Instru.; vol. 41; No. 1; Jan. 1970; pp. 135–136.
Perreault et al; "A Specimen . . . "; J. of Physics E: Sci. Instruments; 21(1988) 1175–1178.
Maskowitz et al; "Mark II Test Vehicle Holder . . . "; Proceedings of the 44th Annual meeting of the Electron Microscope Society of America, 1986.
Rhoden et al; "Electron Microscopy . . . "; MS Thesis; GE85D-77; School of Eng.; Air Force Institute of Technology; Air Force Tech. Report No. AFIT/-GE/ENG/85D-25; Dec. 1985.
Rhoden et al; "Sample Preparation . . . "; Mat. Research Soc. Symposium Proc. vol. 115; 1988.
Kitchen et al; "Crystallographic Orientation . . . "; Proceedings of the 45th Annual Meeting of the Electron Microscope Society of America, 1987.

*Primary Examiner*—Ernest F. Karlsen
*Attorney, Agent, or Firm*—Fredric L. Sinder; Donald J. Singer

[57] ABSTRACT

A power probe for in-situ electron microscope viewing of electromigration in aluminum thin films has a probe holder, a detachable probe tip and, mounted on the probe tip, a quartz power distributor. A test specimen, such as an integrated circuit component, can be viewed inside the electron microscope while logic gates or other components are exercised. The probe holder is shaped to mate to a conventional electron microscope side entry port. The probe tip attaches to the end of the probe holder and extends into the electron beam path. The test specimen mounts on the power distributor which is in turn mounted inside a trough at the end of the detachable probe tip. The probe tip and power distributor include mutually aligned openings, over which the test specimen mounts, for the electron beam path. The power probe is vacuum sealed on the outside by a convention O-ring seal and inside by a female electrical connector mounted on the front end of the probe holder and a male electrical connector mounted on the back end of the probe tip, both electrical connectors being cemented in place with a high-vacuum glue. The power distributor includes bonding pads and a grounding pad for mounting test specimens.

7 Claims, 3 Drawing Sheets

TRANSMISSION ELECTRON MICROSCOPE (TEM) POWER PROBE FOR IN-SITU VIEWING OF ELECTROMIGRATION AND OPERATION OF AN INTEGRATED CIRCUIT OR MICROPROCESSOR

RIGHTS OF THE GOVERNMENT

The invention described herein may be manufactured and used by or for the Government of the United States for all governmental purposes without the payment of any royalty.

BACKGROUND OF THE INVENTION

The present invention relates generally to specimen mounts for use with transmission electron microscopes, and more particularly to a power probe for in-situ viewing of electromigration in integrated circuits and in-situ operation of integrated circuits or microprocessors.

Electromigration in aluminum thin film conductors is a likely source of unreliability in integrated circuits. Electromigration is the mass transport of atoms in a conductor under a current stress. The interconnections inside integrated circuits, called lines, stripes or linestripes, are generally made of a thin aluminum or aluminum alloy (Al-1% Si) film. Electromigration in aluminum can occur, at elevated temperatures ($<600°$ C.), at current densities greater than $10^5$ amps/cm$^2$. With the maturing of Very Large Scale Integrated (VLSI) technology, decreasing feature size and increasing gate densities (exceeding 10,000 gates/cm$^2$) are resulting in higher current densities exceeding $10^6$ amps/cm$^2$, while linestripe widths are reaching into the submicron range.

The failure modes in aluminum thin film conductors from electromigration are characteristically cracks, voids or hillocks in the linestripes, resulting in open circuits. Most of the research to date of electromigration in aluminum conductors has been directed to examining the formation of these voids and hillocks. However, experiments have also shown that short-circuits caused by whisker formation between adjacent stripes, or between multi-level structures, can be equally damaging to integrated circuit performance. Because of the importance of this failure mode in integrated circuits, and so that means for reducing its effect may be developed, further research in the nature of this phenomenon is clearly needed.

Descriptions of previous investigations for gaining improved understanding of electromigration in aluminum films in-situ in transmission electron microscopes (TEMs), in which investigations the inventors have variously participated, may be found in "Crystallographic Orientation of Aluminum Whiskers Formed by Electromigration Using Transmission Electron Microscopy," D. R. Kitchen, S. L. Linder, R. E. Omlor and P. F. Lloyd, *Proceedings of the 45th Annual Meeting of the Electron Microscope Society of America*, 1987; "Sample Preparation of Aluminum Bridge Test Vehicles for TEM In-Situ Crystallographic Studies of Electromigration,"  W. E. Rhoden, J. V. Maskowitz, D. R. Kitchen, R. E. Omlor and P. F. Lloyd, *Material Research Society Symposium Proceedings*, Vol. 115, 1988; "Mark II Test Vehicle Holder for In Situ Viewing of Integrated Circuit Electromigration, " J. V. Maskowitz, W. E. Rhoden, D. R. Kitchen, R. E. Omlor and P. F. Lloyd, *Proceedings of the 44th Annual Meeting of the Electron Microscopy Society of America*, 1986; and, *Electron Microscopy Observation of Electrotransport*. J. V. Maskowitz and W. E. Rhoden, MS Thesis, GE85D-77, School of Engineering, Air Force Institute of Technology, Air Force Technical Report No. AFIT/GE/ENG/85D-25, December, 1985.

To perform these and similar studies, an aluminum linestripe has to be freely suspended, without an interfering silicon substrate, inside the ultra-high vacuum and in the electron beam path of a transmission electron microscope. Electrical current has to be supplied to the linestripe inside the TEM so that electromigration can be viewed in real time. As described in the studies, to achieve this the investigators first constructed an unique Bridge Test Vehicle (BTV) in which substrate material was etched away from vapor-deposited aluminum film to leave freely suspended ("bridge") test patterns of aluminum linestripes supported by the surrounding unetched test vehicle structure for mounting on a holder. A JOEL EM-SHH heating holder, manufactured by JOEL USA, Inc., Boston, Mass., was modified to hold the Bridge Test Vehicle in the path of the electron beam. A heating holder provides a means for heating and holding a specimen in the electron beam path. It mounts through a side hole, or goniometer, in an electron microscope and includes vacuum sealing at the side hole and electrical leads through the holder to power the heater at its tip.

The modified holder, called a Mark II holder, provided the technical means to prove the concept of powered circuit operation inside the ultra-high vacuum environment of an transmission electron microscope. Before its invention, similar electromigration studies could be performed only by first applying a current to the test sample, or specimen, in the open air and then placing the test sample inside the TEM for investigation. After viewing, the sample was removed and the current reapplied, followed by again placing inside the TEM. This cycle was repeated with successively higher current densities until the test was completed or the sample failed. This testing method particularly suffered from the contaminating effect of the atmosphere and handling while under test. Also, artificial electric, thermal and mechanical stresses were placed on the sample from starting, stopping, and restarting the current. Additionally, structural changes occurring in the sample could not be viewed or recorded in real time as they occurred. The Mark II holder for the first time permitted investigators to perform real time electromigration studies inside the ultra-high vacuum environment of a transmission electron microscope. The Mark II holder validated the concept of powered electronic devices operating inside the ultra-high vacuum environment of a transmission electron microscope.

Despite its substantial contribution to the prior art, the Mark II holder nevertheless had several deficiencies. For example, changing specimens was particularly time-consuming and inconvenient. At least one day was required to remove and replace a test specimen. Also, the small specimen area limited the size of the test vehicle. Wire bonding to the test vehicle was difficult due to the awkward orientation of the test vehicle to the holder. The brittle nature of the power leads and limited access to them added to the difficulty of making electrical connections to the test vehicle. Due to the nature of its adaptation from the JEOL heating holder, only two linestripes could be tested in-situ at ultra-high vacuum. The power application and distribution to the linestripe or test object was severely limited. Also, the temperature of the linestripe (or thin film) could not be regulated to any extent. Finally, only linestripes could be exercised and not integrated circuits or microprocessor devices.

Thus it is seen that there is a need for an improved specimen or test vehicle holder that includes all the advantages of the Mark II holder without its deficiencies.

It is, therefore, a principal object of the present invention to provide an improved test vehicle holder for use inside a transmission electron microscope that permits real time electromigration studies to be performed inside a high-vacuum environment such as the interior of an electro microscope.

It is another object of the present invention to provide an improved test vehicle holder that permits rapid and convenient changing of test samples and specimens.

It is a further object of the present invention to provide an improved test vehicle holder that permits multiple exercising of many different linestripes.

It is yet another object of the present invention to provide a test vehicle holder that permits adequate temperature compensation during an experimental run.

It is yet a further object of the present invention to provide a test vehicle holder that permits VLSI/VHSIC circuits and microprocessor devices to be examined inside a transmission electron microscope while specific locations, such as linestripes, memory cells, nodes, logic gates, active transistor areas, capacitors and so forth, are exercised.

It is still another object of the present invention to provide a test vehicle holder that permits convenient interface with commercial electronic test signal generators, monitors and analysis devices.

It is a unique feature of the present invention that it will permit reliability testing of integrated circuits with known faults inside a transmission electron microscope.

It is another feature of the present invention that it will permit the study of electron beam induced current effects inside an integrated circuit.

It is a further feature of the present invention that it will permit examination of integrated circuits by voltage contrasting.

It is yet another feature of the present invention that it will permit morphology changes of polycrystalline linestripes to be predicted.

It is yet a further feature of the present invention that it will also work inside other viewing apparatus such as a scanning electron microscope, a microprobe, a scanning Auger microprobe and an Electron Spectroscope for Chemical Analysis (ESCA).

It is a principal advantage of the present invention that it will permit real time exercising of seven test stripes or specimens for electromigration studies.

It is another prime advantage of the present invention that it will distribute power to multiple locations in an examination area while simultaneously maintaining temperature heating or cooling.

It is a further advantage of the present invention that its manufacture will be straightforward and its operation convenient.

It is yet another advantage of the present invention that it is compatible with test devices that generate continuous AC, DC or pulsed signals.

It is yet a further advantage of the present invention that it is compatible with straightforward commercial electronic performance monitors and analyzers.

It is also an advantage of the present invention that it will permit the exercise, observation and subsequent performance analysis of single or multiple circuit design features to include gates, vias, metallization lines, polycrystalline lines, bonding pads and wire interconnects.

It is still another advantage of the present invention that it will permit chemical analysis of integrated circuits when used with an Electroscope for Chemical Analysis (ESCA).

These and other objects, features and advantages of the present invention will become apparent as the description of certain representative embodiments proceeds.

SUMMARY OF THE INVENTION

The present invention provides a power probe for holding and providing power to a a test specimen inside a transmission electron microscope. The unique discovery of the present invention is that multiple electromigration tests of linestripes can be performed in real time simultaneously with maintaining a high-vacuum environment. Furthermore, different linestripes can be powered to different voltage levels simultaneously. A power distributor, included as part of a detachable probe tip, insures this unique and essential feature.

Accordingly, the present invention is directed to a power probe for holding a test specimen for viewing inside a transmission electron microscope, comprising a probe holder, a detachable probe tip attached to an end of the probe holder, wherein the probe tip includes a first opening, a power distributor mounted on the probe tip, wherein the power distributor includes a second opening, aligned with the probe tip first opening, over which can be positioned the test specimen, a grounding pad and a plurality of bonding pads mounted on the power distributor for electrical lead connection to the specimen, means for vacuum sealing the probe holder from the probe tip, and, electrical connection means extending from the grounding pad and bonding pads, through the vacuum sealing means, to outside the probe holder. The power distributor may be made of quartz. The probe holder may further comprise a handle end and an insertion end, wherein the detachable probe tip attaches to the insertion end. The probe tip may further comprise a trough section for holding the power distributor. The electrical connection means may further comprise first and second cooperating electrical connectors, the first electrical connector mounted in the probe holder and the second electrical connector mounted in the probe tip, a first plurality of wire leads extending from outside the probe holder, through the probe holder, and operatively terminating at the first electrical connector, and a second plurality of wire leads extending from the second electrical connector and operatively terminating at the grounding pad and bonding pads.

The present invention is also directed to a power probe for holding a test specimen for viewing inside a transmission electron microscope, comprising a probe holder, a detachable probe tip attached to the end of the probe holder, wherein the probe tip includes a trough having a first opening in the bottom of the trough, a generally flat power distributor positioned inside the trough section, wherein the power distributor includes a second opening aligned with the trough section opening over which can be placed the test specimen, a grounding pad and a plurality of bonding pads mounted on the power distributor for electrical lead connection to the specimen, means for vacuum sealing the probe holder from the probe tip, and electrical connection means extending from the grounding pad and bonding pads, through the vacuum sealing means, to outside the probe holder. The power distributor may be made of quartz.

DESCRIPTION OF THE DRAWINGS

The present invention will be more clearly understood from a reading of the following detailed description in conjunction with the accompanying drawings wherein.

DETAILED DESCRIPTION

Figure 1:
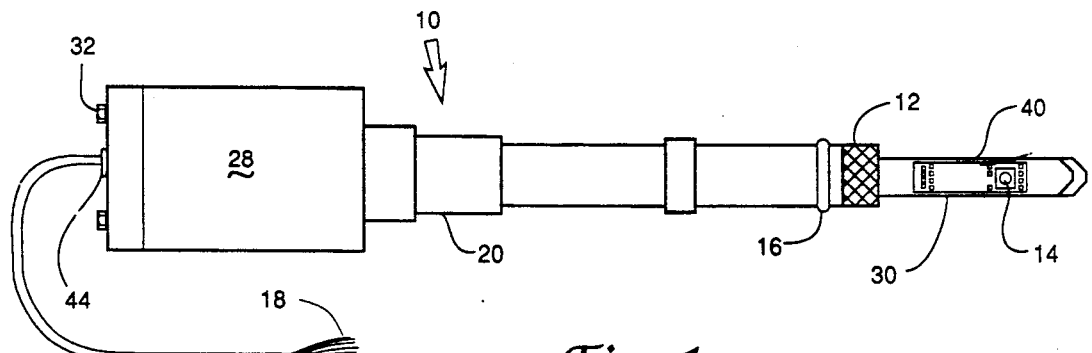
FIG. 1 is a top view of a power probe according to the teachings of the present invention showing its component probe holder, detachable probe tip and power distributor.

Referring now to FIG. 1 of the drawings, there is shown a top view of a power probe 10 according to the teachings of the present invention showing its component probe holder 20, detachable probe tip 30 and quartz power distributor 40. A locknut 12 attaches probe tip 30 to probe holder 20. In its basic use and operation, power probe 10 inserts inside an electron microscope through a conventional side entry port or airlock, also sometimes called a goniometer. Probe holder 20 is shaped to cooperatively mate with the side entry port and to partially extend outside the electron microscope housing so that it can be manipulated. Probe holder 20 effectively operates as a handle for inserting, rotating and extracting a test specimen for viewing. The test specimen is held over an opening 14 through quartz power distributor 40. Opening 14, and the specimen, are aligned with the electron beam path inside the electron microscope. Vacuum sealing around the outside of probe holder 10 is accomplished by a conventional O-ring seal 16. Vacuum sealing through the inside of probe holder 10 is accomplished through sealed electrical connectors as will be described later. Because probe tip 30 is easily detachable, different test specimens can be quickly changed though the use of pre-prepared extra probe tips 30.

Figure 4:
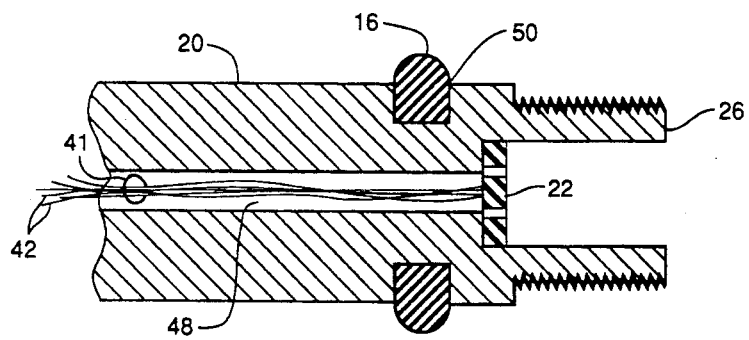
FIG. 4 is a cross-sectional side view of details of the threaded end of the probe holder.

Electrical leads 18, numbering eight in this embodiment and separately insulated from each other, extend from outside power probe 10 through probe holder 20 to connect to an eight pin female electrical connector 22 located inside probe holder 20 just ahead, in this embodiment, of O-ring seal 16. Female electrical connector 22 is shown in FIG. 4. Leads 18 are made in this embodiment with size 20 AWG wire. Conventional banana type plugs or other connectors may be attached to the ends of leads 18.

Figure 2:
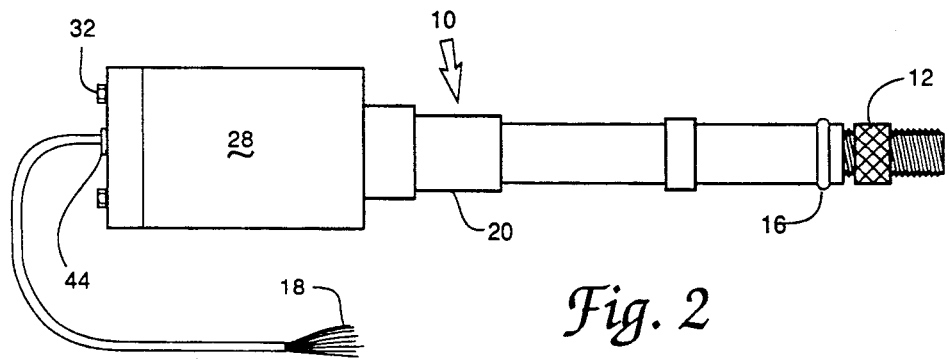
FIG. 2 is a side view of the probe holder and showings its threaded end for attaching the detachable probe tip.

FIG. 2 is a side view of probe holder 20 showing a threaded end 26 for connecting detachable probe tip 30 with lock nut 12.

Figure 3:
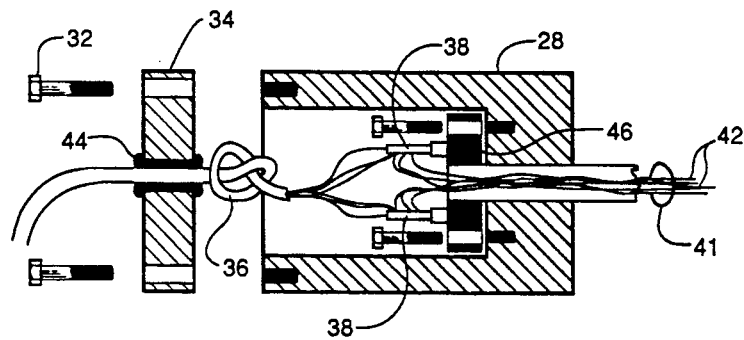
FIG. 3 is a cross-sectional side view of details of the threaded end of the probe holder.

FIG. 3 is a cross-sectional side view of details of the handle end 28 of probe holder 20. Machine screws 32 attach a cover 34 to handle end 28. Electrical leads 18 are tied into a knot 36 to provide stress relief for the leads's connection to bonding posts 38. From bonding posts 38, a bundle 41 of electrical leads extend through the inside of probe holder 10. Handle end 28 also includes a rubber grommet 44 and a rubber wafer 46 into which bonding posts 38 are screwed.

FIG. 4 is a cross-sectional side view of details of the threaded end 26 of probe holder 10. Electrical leads 42 of bundle 41 from bonding posts 38 connect to the back of eight pin female electrical connector 22. Female connector 22 is cemented into place with Torr Seal High Vacuum Glue, a low-vapor pressure epoxy glue available from Varian Vacuum Division, Varian, Inc., Palo Alto, Calif. Torr Seal also fills the axial opening 48 around lead bundle 41 to further ensure a high-vacuum seal. O-ring seal 16 fits mounts along groove 50.

Figure 5:
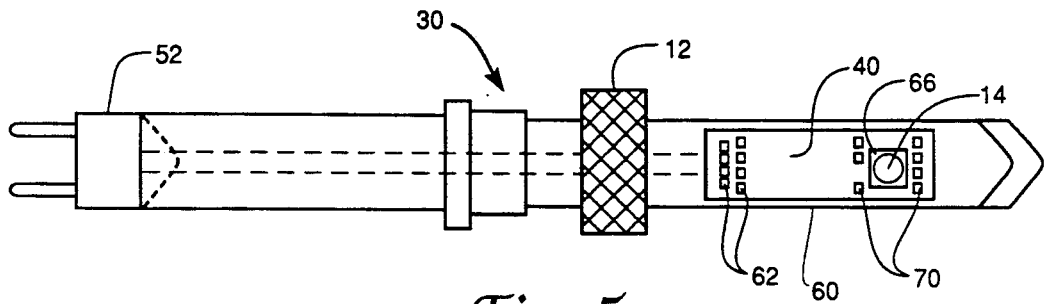
FIG. 5 is a top view of the detachable probe tip showing the location of the power distributor.
Figure 6:
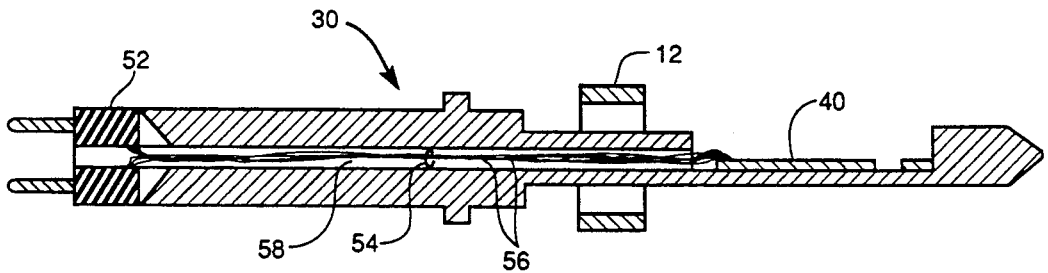
FIG. 6 is a cross-sectional side view of details of the probe tip.
Figure 7:
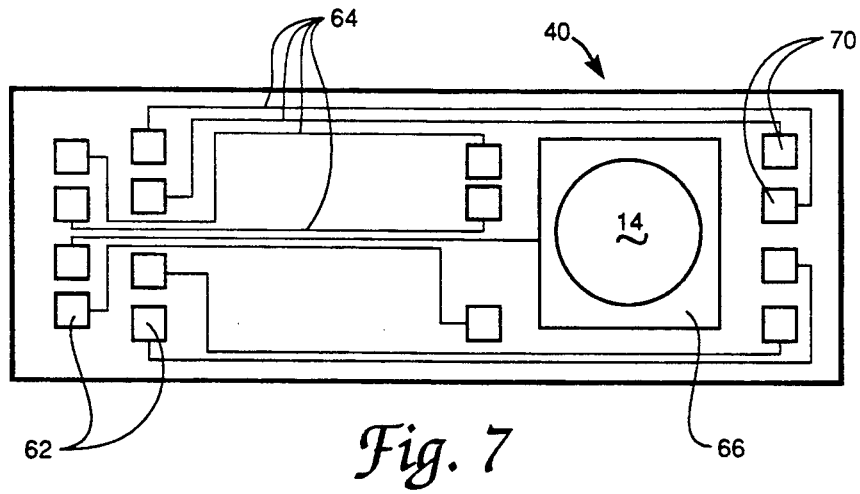
FIG. 7 is a top view of the quartz power distributor.
Figure 8:
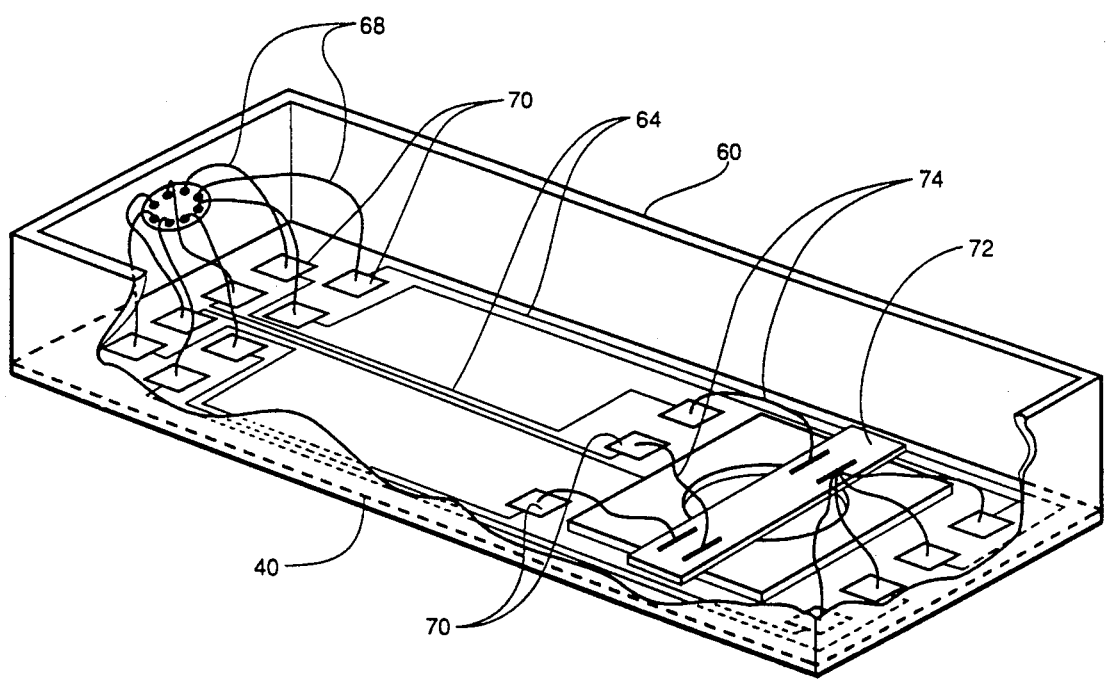
FIG. 8 is a perspective view of the quartz power distributor inside a trough end of the detachable probe tip.

FIG. 5 is a top view, and FIG. 6 a side cross-sectional view, of detachable probe tip 30. An eight pin male electrical connector 52 is cemented with Torr Seal to the back end of probe tip 30. Male electrical connector 52 mates with female electrical connector 22 and electrically connects bundle 41 of leads 42 to bundle 54 of leads 56 which extend through an axial opening 58 inside probe tip 30. Torr Seal fills axial opening 58 to ensure the high-vacuum seal. Quartz power distributor 40, also called a quartz stage, is cemented with Torr Seal to the bottom of a trough 60 formed at the end of probe tip 30. Trough 60 is shown more clearly in the perspective view of FIG. 8. Trough 60 is recessed to fit through the side entry port and past interfering internal structures to extend to the electron beam path without obstruction. Power distributor 40 includes a metallization layer of aluminum made using standard photolithography techniques. The metallization layer comprises bonding pads 62, linewidths 64 and grounding pad 66. The widths of linewidths 64 are selected to withstand the high current loads required for electromigration experiments. 10 mil wire leads 68 extend from their operative connection to leads 56 at one end of trough 60 to bonding pads 62. Linewidths 64 then carry power or signals from bonding pads 62 to bonding pads 64.

In this embodiment, the overall length of power probe 10 is 13.3 inches. The length of handle end 28 is 2.913 inches and its diameter is 1.614 inches. The diameter at the threaded end of probe holder 20 is about 0.539 inches. The length of probe tip 30 from locknut 12 to its tip is about 3.025 inches. Its width across is about 0.354 inches. Power distributor 40 is about 2 inches long, 0.25 inches wide and 0.025 inches deep. Electrical connectors 22 and 52 meet or exceed MIL-STD-883B.

In operation, a circuit under test (CUT) 72, such as the shown bridge test vehicle, or any test specimen, rests on grounding pad 66. Grounding pad 66 prevents charge build-up on the circuit or on power distributor 40 during testing or observation. Conventional 1 mil aluminum wire leads 74 are used to electrically connect circuit under test 74 to bonding pads 70 and, via linewidths 64, to bonding pads 62, 10 mil wire leads 68, lead bundle 54, male electrical connector 52, female electrical connector 22, lead bundle 42, bonding posts 38, and finally to outside electrical leads 18. Leads 74 attached to the circuit under test using conventional bonding methods.

A circuit under test will generally not require connection to all bonding pads 70, leaving free other bonding pads for other uses at the same time a circuit is being tested. For example, resistance heaters can be connected across a pair of bonding pads 70 and power applied to provide temperature compensation and control. Similarly, thermocouples can be connected to measure temperature.

The disclosed power probe successfully demonstrates the use of a detachable probe tip and a specially designed power distributor for supporting and supplying power to a variety of integrated circuit components inside a transmission electron microscope. Although the power probe is specialized, its teachings will find application in other areas where physical components require testing in an unique testing environment different from their normal operating environment and where the components need to be operating while under test.

It will be seen by those with skill in the field of the invention that the power probe, particularly its outside shape, can be easily modified to work within a Scanning Electron Microscope (SEM), AUGER, ESCA, microprobe or any other instrument that examines small devices which require power. Further, a variety of tests, in addition to electromigration studies, can be performed with the power probe such as voltage contrasting, electron beam induced current effects (EBIC) and thermal testing or cycling. The probe, when used with those instruments, will permit investigation of metal migration at high current densities, ION mobility within the substrate, impurity analysis and time-to-failure as a function of time. The probe will permit investigation of surface anomalies and the result of irregular localized heating on an integrated circuit or microprocessor. The probe will also permit the investigation of electron beam induced charge build-up at critical junctions in the circuit. The probe will further permit the exercise, observation and subsequent performance analysis of single or multiple gates, vias, metallization lines, polycrystalline lines, bonding pads and wire interconnects. A particularly valuable adaptation of the probe permits mounting and testing multiple test specimens at the same time by taking advantage of its many leads. Different tests can be run on the separate test specimens by moving about probe tip opening 14 to alternately subject each specimen to the electron beam, all without having to remove power probe 10 from the microscope.

Other modifications to the invention as described may be made, as might occur to one with skill in the field of the invention, within the intended scope of the claims. Therefore, all embodiments contemplated have not been shown in complete detail. Other embodiments may be developed without departing from the spirit of the invention or from the scope of the claims.

We claim:

1. A power probe for holding a test specimen for viewing inside a transmission electron microscope, comprising:
   (a) a probe holder;
   (b) a detachable probe tip attached to an end of the probe holder, wherein the probe tip includes a first opening;
   (c) a power distributor mounted on the probe tip, wherein the power distributor includes a second opening, aligned with the probe tip first opening, over which can be positioned the test specimen;
   (d) a grounding pad and a plurality of bonding pads mounted on the power distributor for electrical lead connection to the test specimen;
   (e) means for vacuum sealing the probe holder from the probe tip; and,
   (f) electrical connection means extending from the grounding pad and bonding pads, through the vacuum sealing means, to outside the probe holder.

2. The power probe according to claim 1, wherein the power distributor is made of quartz.

3. The power probe according to claim 1, the probe holder further comprising a handle end and an insertion end, wherein the detachable probe tip attaches to the insertion end.

4. The power probe according to claim 1, the probe tip further comprising a trough section for holding the power distributor.

5. The power probe according to claim 1, the electrical connection means further comprising:
   (a) first and second cooperating electrical connectors, the first electrical connector mounted in the probe holder and the second electrical connector mounted in the probe tip;
   (b) a first plurality of wire leads extending from outside the probe holder, through the probe holder, and operatively terminating at the first electrical connector; and,
   (c) a second plurality of wire leads extending from the second electrical connector and operatively terminating at the grounding pad and bonding pads.

6. A power probe for holding a test specimen for viewing inside a transmission electron microscope, comprising:
   (a) a probe holder;
   (b) a detachable probe tip attached to the end of the probe holder, wherein the probe tip includes a trough having a first opening in the bottom of the trough;
   (c) a generally flat power distributor positioned inside the trough section, wherein the power distributor includes a second opening, aligned with the trough section first opening, over which can be placed the test specimen;
   (d) a grounding pad and a plurality of bonding pads mounted on the power distributor for electrical lead connection to the test specimen;
   (e) means for vacuum sealing the probe holder from the probe tip; and,
   (f) electrical connection means extending from the grounding pad and bonding pads, through the vacuum sealing means, to outside the probe holder.

7. The power probe according to claim 6 wherein the power distributor is made of quartz.

* * * * *